United States Patent
Hughes et al.

(10) Patent No.: US 8,586,417 B1
(45) Date of Patent: Nov. 19, 2013

(54) ISOSTRESS GRID ARRAY AND METHOD OF FABRICATION THEREOF

(71) Applicant: BAE Systems Information and Electronic Systems Integration Inc., Nashua, NH (US)

(72) Inventors: John A. Hughes, Falls Church, VA (US); Christy A. Hagerty, Haymarket, VA (US); Santos Nazario-Camacho, Woodbridge, VA (US); Keith K. Sturcken, Nokesville, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/951,502

(22) Filed: Jul. 26, 2013

Related U.S. Application Data

(62) Division of application No. 12/923,581, filed on Sep. 29, 2010, now Pat. No. 8,519,527.

(60) Provisional application No. 61/272,484, filed on Sep. 29, 2009.

(51) Int. Cl.
*H01L 23/49* (2006.01)

(52) U.S. Cl.
USPC .......... 438/121; 438/611; 438/123; 438/617; 257/E23.024; 257/696

(58) Field of Classification Search
USPC .......... 438/121, 611, 123, 617; 257/E23.024, 257/E23.033, 696, 697
See application file for complete search history.

(56) References Cited

U.S. PATENT DOCUMENTS

| | | | |
|---|---|---|---|
| 3,795,037 A * | 3/1974 | Luttmer | 29/883 |
| 6,646,356 B1 * | 11/2003 | Whalen et al. | 257/784 |
| 6,680,217 B2 * | 1/2004 | Whalen et al. | 438/106 |
| 2008/0285211 A1 * | 11/2008 | Zaghib et al. | 361/528 |
| 2008/0285244 A1 | 11/2008 | Knickerbocker | |

\* cited by examiner

*Primary Examiner* — S. V. Clark
*Assistant Examiner* — Krista Soderholm
(74) *Attorney, Agent, or Firm* — Buchanan Ingersoll & Rooney PC; Daniel J. Long

(57) ABSTRACT

An electronic device package includes a substrate and wire columns arranged in groups about a neutral stress point of the substrate. The height of the wire columns is substantially uniform for the plural groups of wire columns, and a length of at least one of the wire columns is greater than the uniform height. A method of fabricating an electronic device package having a column grid array includes applying two templates on wire columns of the column grid array and bending at least one wire column to increase its length while maintaining a uniform height for the column grid array. In another aspect, an electronic device package substrate includes wire columns having at least one non-uniformity in lengths of the columns, and the length of a wire column corresponds to a distance of that wire column from the neutral stress point of the substrate. The non-uniformity of length in the wire columns reduces stress in the package leads after attachment of the package to a carrier substrate, such as a printed circuit board.

7 Claims, 2 Drawing Sheets

US 8,586,417 B1

ISOSTRESS GRID ARRAY AND METHOD OF FABRICATION THEREOF

RELATED APPLICATION

This is a divisional application of U.S. application Ser. No. 12/923,581 filed Sep. 29, 2010 and claims priority under 35 U.S.C. §119 to U.S. Provisional Application No. 61/272,484 filed Sep. 29, 2009, the content of which is incorporated herein by reference in its entirety.

FIELD

An electronic device package including a column grid array, and a method of fabricating an electronic device package having a column grid array, are disclosed.

BACKGROUND

High input/output (I/O) count electronic device packages can have an integrated circuit (IC) bonded to one side of a substrate and an array of metal connectors extending from the opposite side of the substrate. The electrical connectors of the array can be soldered or welded to a carrier substrate, such as a printed circuit board (PCB).

Two known types of electronic device package connection configurations are ball grid array (BGA) and column grid array (CGA). BGA utilizes small solder balls that are arranged into an array on the package's substrate, and can, for example, be used for small chip applications or applications having a well-characterized operating environment. CGA utilizes solder columns that are taller and have less tin content than solder balls of BGA, which provide a more compliant and flexible I/O connection points that can withstand large temperature or mechanical fluctuations. CGA can provide long life and high reliability, and can be used for in high-performance applications.

SUMMARY

An exemplary electronic device package is disclosed which includes a substrate and wire columns arranged in plural groups about a neutral stress point of the substrate. The height of each of the wire columns is substantially uniform for the plural groups of wire columns, and a length of the wire columns increases for each group as a function of each group's distance from the neutral stress point.

An exemplary method for fabricating an electronic device package having a substrate and a column grid array includes applying wire columns of the column grid array in a first direction through holes in a first removable template such that portions of the wires protrude from the first removable template to provide a uniform distance between the first removable template and the substrate. The wire columns protruding from first removable template are applied to a second removable template. At least one of the wire columns in bent to increase the length of a wire column between the first removable template and said substrate while maintaining the uniform distance.

BRIEF DESCRIPTION OF DRAWINGS

The accompanying drawings provide a further understanding of exemplary embodiments and are incorporated in and constitute a part of this specification. The drawings, with the description serve to explain the principles of the invention. In the drawings.

DETAILED DESCRIPTION

Figure 1A:
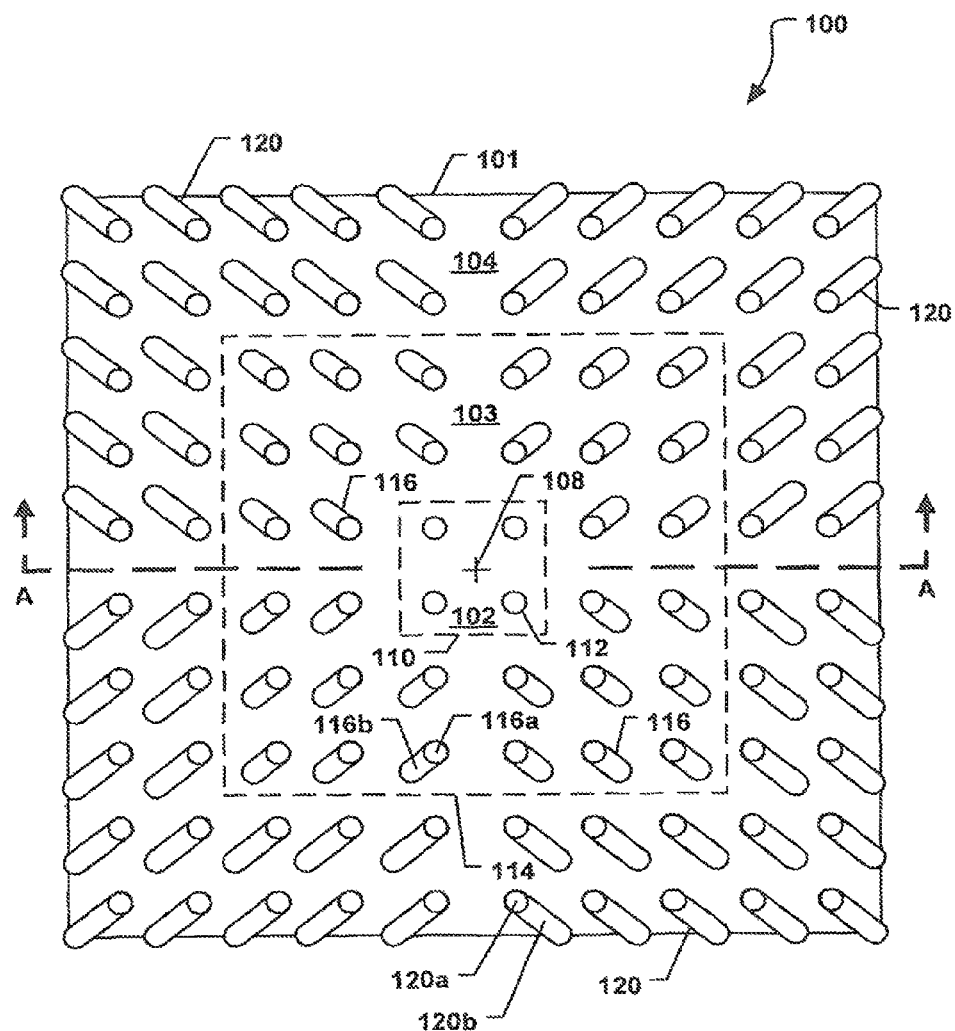
FIG. 1A is a diagram showing a bottom view of a column grid array package in accordance with an exemplary embodiment.

FIG. 1A shows a bottom view of an electronic device package 100 according to an exemplary embodiment. The electronic device package 100 includes a column grid array comprising wire columns 112, 116 and 120 arranged on one side of a substrate 101. On the opposite side of the substrate, an IC chip or other electronic device can be bonded to the substrate 101. Interconnections electrically connected to the electronic device can be formed through the substrate 101 to plural contact pads on the opposite side of the substrate 101, and the wire columns 112, 116 and 120 can be attached to these contact pads.

The substrate 101 can comprise a material having a coefficient of thermal expansion different from a carrier substrate that the column grid array package 100 can be attached to, such as printed circuit board. For example, the substrate 101 can comprise a material such as a ceramic material or silicon, and the carrier substrate material can comprise a polymer or another thermally mismatched material. During a thermal event, the mismatch between the coefficients of thermal expansion of the substrate 101 and the carrier substrate causes these materials to expand at rates different from, one another. Frequent temperature cycling over time can cause multiple cycles of expansion and contraction, leading to cumulative stress and strain effects on the solder material, which can eventually lead to failure at a wire column attachment point, in aggressive environments, thermal cycling can occur even more frequently, causing devices to fail at a corresponding accelerated rate.

The length of wire columns can be increased to reduce strain during thermal expansion because the strain is inversely proportional to wire column length, and a reduction in strain, in turn, reduces stress. However, increasing the length of each of the wire columns can correspondingly increase susceptibility to vibration, and at some point, the length cannot be increased further to improve fatigue life without introducing unacceptable vibration. Additionally, standoff distance requirements between the package substrate 101 and the carrier substrate may prevent simple increases in column length beyond a specified value.

Embodiments described herein can reduce stress in a wire column while maintaining a specified height by bending the column one mode past the buckling mode appropriate for that wire column's distance from the neutral stress point of the package. As referenced herein, a "neutral stress point" is a point on the electronic device package that would exhibit little or no movement relative to a carrier substrate when the electronic device package is attached to the carrier substrate and subjected to thermal cycling. The location of the neutral stress point can be, for example, close or even very close to the geometric center of an electronic device package substrate for electronic device packages having a symmetrical shape or symmetry in wire column arrangement. For example, the embodiment of FIG. 1A, the substrate 101 includes a neutral stress point 108 located in the center of the substrate 101, and the wire columns 112, 116 and 120 are arranged about the neutral stress point 108.

Wire columns can deform through strain hysteresis over the fatigue life of an electronic device package in fixed buckling modes. The stress imposed on a column grid array of an electronic device package from thermal expansion mismatches can be greater at outer points of the array than areas closer to the neutral stress point because these outer points expand more from the cumulative effects of expansion of inner areas. The strain (proportional to stress) experienced by a column can be a function of that column's distance from the neutral stress point of the electronic device package. As the distance from the center of the array increases in any direction, the strain due to thermal cycling and imposed by column expansion increases until the outermost columns experience the most strain and undergo the highest fatigue or failure.

These failure rates can be described, for example, by the Coffin-Manson equation by relating elements of temperature, frequency of cycling, and applied stress due to thermal expansion. The equation can be stated to relate the number of cycles of fatigue as being proportional to the amount of stress in the columns experiencing a thermal cycle. This implies that the amount of stress experienced is inversely proportional to the length of the column experiencing stress. As a result, the columns in the center of an array can comprise a smaller length than columns at the edges of the array. These columns can be divided into groups, with each group having substantially the same length. This length can increase as the distance of a group from the neutral stress point of the column array increases.

Figure 1B:
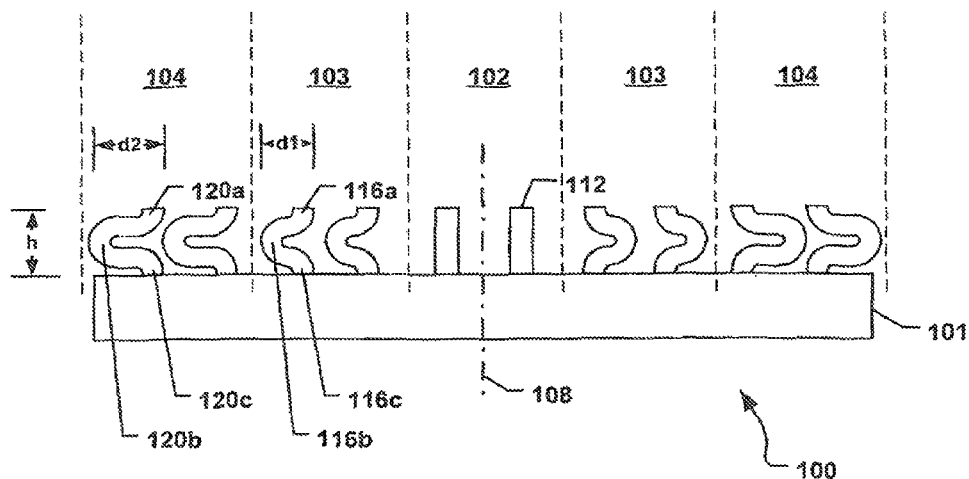
FIG. 1B is a diagram of a side view of a column grid array package according to an exemplary embodiment.

Referring now to FIG. 1B, a side view is shown of the exemplary electronic device package 100 embodiment taken along the section A-A of FIG. 1A. FIG. 1B illustrates a substantially uniform height h (e.g., heights within ±10%, or greater or lesser), for example, corresponding to a standoff distance, between the package substrate 101 and a carrier substrate. While the height h is essentially uniform for all the wire columns 112, 116 and 120, bends can be included in at least one of the wire columns to increase the lengths of that column. More particularly, FIG. 1B shows details of an exemplary embodiment including a bent portion 116b between end portion 116a and 116c of a wire column 116, and a bent portion 120b between end portions 120a and 120c of a wire column 120.

Although FIGS. 1A and 1B show an embodiment of an electronic device package 100 having groups of wire columns with different sized bent portions, it will be appreciated that embodiments can include Wire columns having one or more bends of only one size, or that other embodiments can have all the wires columns bent to one size. Also, while the wire column sections 116b and 120b are depicted in the exemplary embodiment of FIG. 1A at an angle of about 45 degrees from a horizontal direction across the figure, which would allow use of greater sized bends for a particular wire column pitch, it is to be understood that embodiments can include columns that are bent only in one direction and/or at any orientation with respect to one another and the package substrate.

Exemplary embodiments can include wire columns lengths that increase as a function of a wire column's distance from the package's neutral stress point. This non-uniformity in column length can provide a more uniform stress gradient across the array. Embodiments can include continuous-like increases in wire column lengths, where each column length is proportional to its distance from the neutral stress point. Other embodiments can include wire columns sectioned into plural groups. Wire columns in each group have a uniform height sufficient to maintain a standoff distance between the package substrate and a carrier substrate; and a uniform length that corresponds to a buckling mode quantized for that group, wherein the length of the wire columns is different between at least two of the groups. The quantization of the buckling modes for plural groups can be determined in a practical and convenient way for ease of manufacture.

For example, FIGS. 1A and 1B show a group 102 of wire columns 112 within the area defined by dashed line 110, which is nearest to the neutral stress point 108. Each of the wire columns 112 has no bent portion, and thus the length of each column 112 is equal to the height h. The next group 103 of wire columns 116 is located between dashed lines 110 and 114. Each column 116 has a bend 116b to provide a uniform increase in length from the wire columns 112. In a similar fashion, each wire column in a group 104 on the periphery of the package substrate 101 outside the dashed line 114 includes a bent portion 120b larger than the bent portion 116b such that the length of each wire column 120 is more than the length of a wire column 116.

The groups 103 and 104 shown in FIGS. 1A and 1B can be comprised of bands, with one band 104 formed about another band 103. Groups also can have any type of shape, such as circular ring, annular, oblong, elliptical, rectangular, or another type of shape.

Other embodiments can include different types of grouping configurations. For example, package embodiments that do not significantly expand in one direction, such as rectangular shaped packages, can have subgroups sections one group formed in a non-contiguous manner. Another exemplary non-contiguous embodiment can include a circular grouping scheme, with each of the four corners of the package substrate 101 including a subgroup of wire columns that are longer than wire columns of a neighboring group formed closer to the neutral stress point 108.

FIG. 1B shows two exemplary bend geometries for a wire column and the height of the wire columns, h, which is the linear distance between end points of the wire columns. It is to be understood that FIG. 1B shows an embodiment including profiles of the wire columns 116 and 120 of FIG. 1A rotated to be aligned with a horizontal direction of the drawing to show the distances d1 and d2 respectively associated with the bend geometries of the wire column portions 116b and 120b. In an exemplary embodiment, the height h of each wire column can be about 0.0870 inches, for example, as a standoff height, although the height may be more or less than this value. For example, the wire column 116 can have a distance d1 of about 0.0646 inches, and the length of the wire column can be about 0.1012 inches (e.g., ±10%). Hence, the bend in the wire column portion 116b increases the wire column distance 16.3% from the height h. The wire column 120 can have a distance d2 of about 0.0900 inches and the length of the wire column can be about 0.1512 inches, which results in a wire length increase of 73.8% from the height h.

While the depicted embodiment shows a bend can be in the shape of a "C," bends in other embodiments can form another shape or configuration (e.g., the shape of an "S" or a spiral shape), which can depend on how much length the column will need based on the distance from the neutral point, the pitch if the wire columns etc.

Figure 2:
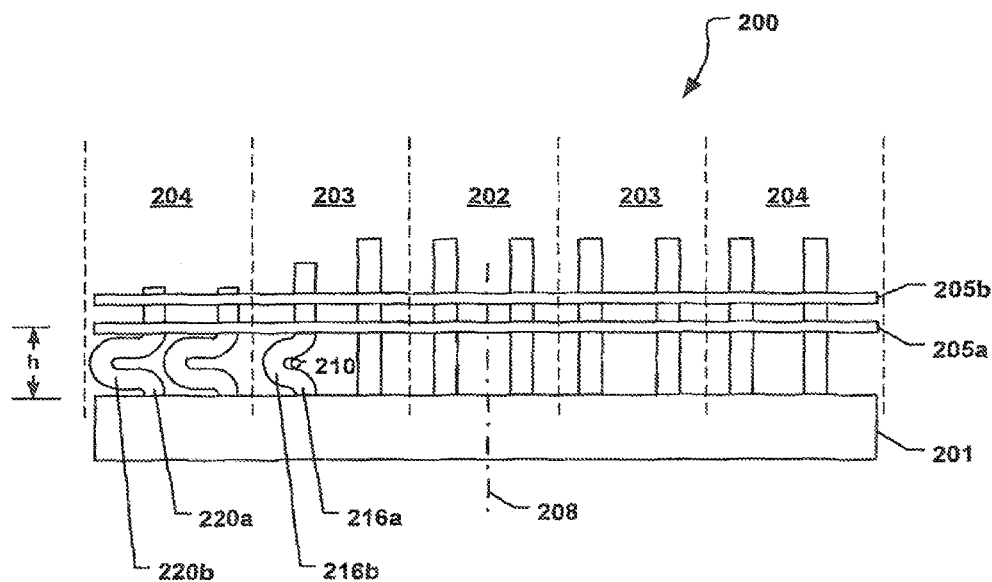
FIG. 2 is a diagram showing a column bending operation accordance with an exemplary embodiment.

With reference now to FIG. 2, there is shown a process of fabricating bends in a column grid array of an electronic device package 200 according to an exemplary embodiment. As shown in FIG. 2, electronic device package 200 includes a substrate 201 that having a grid array of wire columns provided on one of its surfaces. The wire columns are initially much longer than a standoff height h to provide adequate length for forming the largest bends of the package while maintaining the height h.

The wire columns are applied through respective holes in one side of a template 205*a* for cap piece), such that portions of the wire columns protrude from an opposite side of the template 205*a*. The template 205*a* is positioned a distance h from the substrate 201. To maintain the height h, the template 205*a* can include appropriately sized standoffs, or removable spacers of appropriate size can be provided between the template 205 and the substrate 201.

Next, the portions of the wires protruding from the template 205*a* are applied through respective holes in one side of a template 205*b* (or cap piece), such that portions of the wire columns protrude from an opposite side of the second template 205*h*.

After the templates 205*a* and 205*b* are in place on the wire columns, the length of one or more of the wire column can be increased within the area defined by the template 205*a* and the substrate 201. As shown in FIG. 2, a wire bending mechanism 210, such as a rod, bar or hook, can be provided next to the column to be bent and moved to create a bend in the column. For example, the bending mechanism can be moved in a direction parallel with the surface of the substrate 201 to form "C" shaped portions, such as portions 216*b* and 220*h*. For greater efficiency and uniformity, several wire columns can be bent simultaneously. In some embodiments, different sized bends can be formed selectively for different groups of wire columns, such as the groups 202, 203 and 204 depicted in FIG. 2. As described herein, the bend size can be determined based on a distance from a neutral stress point 208 of the substrate 201.

After removal of the template 205*b*, a column-cutting knife can be used to cut off portions of the wire columns protruding from the first template or cap 205*a* to provide the array with a uniform height h and suitable wire column surfaces for attaching to an underlying carrier substrate.

The electronic device package substrate 200 can be a ceramic material, although other types of materials, such as a polymer can be used. The wire columns of a column grid array can be solder material, for example, low tin solder wire compositions such as a 90Pb/10Sn mixture or a high lead solder core mixture wrapped with a copper ribbon. These high lead (i.e., low tin) compositions can increase the degree of flexibility in the column. The bending mechanism 210 can be a rod, bar, dowel or hook, or any other type of elongated device capable of creating bends in wire columns, and can have a cross section shape, such as a circular square, ellipse or ovoid, which facilitates creating a desired type of bend.

While embodiments described herein include the wire columns distributed evenly in an array on a package substrate, other embodiments can include wire columns concentrated about one or more package substrate areas, for example, the center of the package substrate or at the edges of the package substrate. Additionally, a wire column group can have a shape other than the square band shape shown in FIG. 1, for example, polygonal, annular, circular or irregular shape.

Also, while the FIG. 1 embodiment shows an electronic device package substrate having a square shape, it is to be understood that other embodiments of an electronic device package can be another shape, such as rectangular or irregular shape. Additionally, the pin count of 100 solder columns in the depicted embodiment is exemplary and for purposes of explanation. Embodiments of electronic device packages can include a number of pins more or less than this exemplary count.

Also, embodiments described herein may be utilized in combination with existing column grid array apparatuses and techniques to provide enhanced reliability. For example, embodiments of an electronic device package can include corner posts to secure the position of the electronic device package substrate in relation to an underlying carrier such as printed circuit board, as described in U.S. Pat. No. 6,646,356, and method of providing such posts, as described in U.S. Pat. No. 6,680,217, the contents of which are incorporated by reference in their entireties.

It will be apparent to those skilled in the art that various changes and modifications can be made in the electronic device package method of fabricating an electronic device package including a substrate and a column grid array of the present invention without departing from the spirit and scope thereof. Thus, it is intended that the invention cover the modifications of this invention provided they come within the scope of the appended claims and their equivalents.

The invention claimed is:

1. A method of fabricating an electronic device package including a substrate and a column grid array, comprising:
    applying wire columns of the column grid array through holes in a first removable template, such that portions of the wire columns protrude from the first removable template to provide a uniform distance between the first removable template and the substrate;
    applying a second removable template to the wire columns protruding from the first removable template; and
    bending at least one of the wire columns to increase a length of the wire column between the first removable template and said substrate while maintaining the uniform distance.

2. The method of claim 1, wherein the column grid array includes at: least a first group of the wire columns and a second group of the wire columns, each wire column of said second group being located on the substrate at a greater distance from a neutral stress point of the substrate than each wire column of the first group, and said bending increases the length of at least one wire column of the second group such that it is longer than a length of each wire column of the first group.

3. The method of claim 1, wherein said bending at least one of the wire columns comprises:
    inserting a rod into the column grid array between the first and second removable templates and adjacent the at least one wire column; and
    moving the rod in the second direction.

4. The method of claim 3, wherein the rod has a circular cross section.

5. The method of claim 1, comprising:
    removing the second removable template from the wire columns; and
    cutting the portions of the wire columns protruding from the first removable template while maintaining the uniform distance.

6. The method of claim 1, wherein said bending forms a wire column section having a "C" shape.

7. The method of claim 1, wherein said bending comprises:
    bending the at least one wire column at least one mode past a nearest buckling mode of the at least one wire column for the distance of that wire column from a neutral stress point of the substrate.

* * * * *